(12) United States Patent
Nishizawa

(10) Patent No.: US 6,617,244 B2
(45) Date of Patent: Sep. 9, 2003

(54) ETCHING METHOD

(75) Inventor: Atsushi Nishizawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/950,769

(22) Filed: Sep. 13, 2001

(65) Prior Publication Data

US 2002/0037648 A1 Mar. 28, 2002

(30) Foreign Application Priority Data

Sep. 28, 2000 (JP) ........................................ 2000-295905

(51) Int. Cl.$^7$ ............................................... H01L 23/58
(52) U.S. Cl. ...................... 438/637; 438/638; 438/689
(58) Field of Search ................... 438/633, 637, 438/638, 689

(56) References Cited

U.S. PATENT DOCUMENTS

| | | | | | |
|---|---|---|---|---|---|
| 4,595,453 A | * | 6/1986 | Yamazaki et al. | ......... | 156/643 |
| 4,865,685 A | * | 9/1989 | Palmour | ............. | 156/643 |
| 5,354,421 A | * | 10/1994 | Tatsumi et al. | ............. | 156/662 |
| 6,156,642 A | * | 12/2000 | Wu et al. | ................. | 438/637 |
| 6,290,864 B1 | * | 9/2001 | Patel et al. | ................. | 216/79 |
| 6,358,842 B1 | * | 3/2002 | Zhou et al. | ................ | 438/633 |

* cited by examiner

*Primary Examiner*—David Nelms
*Assistant Examiner*—Thao P Le
(74) *Attorney, Agent, or Firm*—Sughrue Mion, PLLC

(57) ABSTRACT

A dry etching method, with a gas containing nitrogen added to an etching gas containing a halogen compound for an SiC film, applies a low dielectric constant film to an interlayer insulating film and reduces parasitic capacitance between groove wirings. In manufacturing of a multilayer wiring structure, an SiC layer and an interlayer insulating film are laminated on a lower layer wiring, and a via hole that reaches the surface of the SiC layer and a wiring groove is formed by dry-etching a region of the interlayer insulating film. The exposed SiC layer is then removed by dry etching, using the interlayer insulating film as an etching mask, and the via hole penetrates the SiC layer to the surface of the lower layer wiring. The penetrating via hole and the wiring groove are filled with a conductive material to form a groove wiring connecting with the lower layer wiring.

23 Claims, 6 Drawing Sheets

ETCHING METHOD

BACKGROUND OF THE INVENTION

1. Field of the Invention

The present invention relates to an etching method used in a method of manufacturing a semiconductor device, and more particularly, a method of dry etching an SiC film and a method of manufacturing a multilayer wiring structure using an SiC film.

The present application is based on Japanese Patent Application No. 295905/2000, filed on Sep. 28, 2000, the contents of which is incorporated herein by reference.

2. Description of the Related Art

As semiconductor device elements become smaller, it is essential to form smaller multilayer wiring for the semiconductor device. In addition, as the semiconductor device is operated at a lower voltage, a higher speed, or the like, it is necessary to form an interlayer insulating film having a lower dielectric constant.

More specifically, in a semiconductor device of a logic system, increased resistance due to smaller wiring and increased parasitic capacitance between wirings results in a reduction of the semiconductor device operation speed. Thus, it is essential to form a small multilayer using a low dielectric constant film as an interlayer insulating film (e.g., a silisesquioxane such as hydrogen silsesquioxane, hereinafter referred to as HSQ) as an interlayer insulating film with a low dielectric constant.

The small wiring width and short wiring pitch result in an increase in the aspect ratio of the wiring and an increase in the aspect ratio of a space between wirings. As a result, techniques for forming a strip of minute wiring longitudinally and embedding an interlayer insulating film in a space between minute wirings become more difficult. Thus, the related art semiconductor device manufacturing process is complicated, and the number of subprocesses in the related art manufacturing process increases.

In the related art system, a groove wiring technique (i.e., a damascene technique) forms a wiring groove in an interlayer insulating film and embeds a wiring material such as copper (i.e., Cu) in the wiring groove by using chemical mechanical polishing (hereinafter referred to as CMP). However, when a wiring groove or a via hole is formed by a reactive ion etching (hereinafter referred to as RIE) process, it is necessary to form an etching stopper layer.

The etching stopper layer is an insulating film with an etching speed different from that of an interlayer insulating film where the wiring groove or the via hole is formed. Various related art techniques using an insulating film with a low dielectric constant as the inter layer insulating film and using a silicon nitride film (SiN film) or a silicon oxide nitride film (SiON film) as the etching stopper layer have been proposed. For example, but not by way of limitation, Japanese Patent Application Laid-open No. Heisei 10-116904 and Japanese Patent Application Laid-open No. Heisei 10-229122 disclose related art manufacturing techniques.

FIGS. 1A to 1C illustrate cross sectional views of a related art manufacturing process of a dual damascene structure. As shown in FIG. 1A, a copper lower layer wiring 101 is formed over a semiconductor substrate (not shown) via an insulating film. Then, a SiN film 102 is formed to cover the copper lower layer wiring 101.

Next, an interlayer insulating film 103 is deposited on the SiN film 102, and the surface of the interlayer insulating film 103 is leveled by CMP. The interlayer insulating film 103 is a silicon oxide film formed in plasma by using a chemical vapor deposition (hereinafter referred to as CVD) method.

Next, using a related art photolithography technique and a related art dry etching technique, a via hole 104 that reaches the surface of the SiN film 102 is formed in the interlayer insulating film 103. Further, a wiring groove 105 is formed in the interlayer insulating film 103. After the via hole 104 and the wiring groove 105 are formed, a resist mask used as an etching mask is removed by using a related art ashing method that ashes the resist mask as an organic film with an oxygen plasma. In the related art ashing process, as shown in FIG. 1A, the copper lower layer wiring 101 is protected by the SiC film 102. Therefore, the copper lower layer wiring 101, which is otherwise easily oxidized, is not exposed to the oxygen plasma, and is protected from the oxidation.

Next as shown in FIG. 1B, using the interlayer insulating film 103 as an etching mask, the SiN film 102 is dry-etched by RIE to form a via hole 104a that reaches the surface of the lower layer wiring 101. The dry etching of the SiN film 102 is performed by introducing a gaseous mixture of $CH_2F_2$, $O_2$, and Ar into a space between parallel plate electrodes. The gaseous mixture is then plasma-excited with a high frequency energy of 13.56 MHz, which is applied between the parallel plate electrodes. In the dry etching step, a ratio of an etching rate of the SiN film 102 to that of the interlayer insulating film 103 (i.e., a selection ratio) is about 3 to 5, and the film thickness of the SiN film 102 is about 50 nm.

As illustrated in FIG. 1C, after a thin tantalum nitride (TaN) film and a copper film are laminated, the lamination film is processed by CMP, so that a barrier layer 106 and a groove wiring 107 are formed in a predetermined region of the interlayer insulating film 103. The barrier layer 106 and the groove wiring 107 are electrically connected to the copper lower layer wiring 101. By the above related art processes, the related art dual damascene wiring structure can be obtained.

However, the related art as described above has various problems and disadvantages. For example, but not by way of limitation, since the dielectric constant of the etching stopper layer increases, the parasitic capacitance between the copper lower layer wiring 101 and the upper layer wiring 107 in the multilayer wiring structure increases. In addition, a parasitic capacitance between wirings of the same layer increases due to a fringe effect generated between wirings of the same layer through the SiN film 102.

Further, in the above described example, a relative dielectric constant of the SiN film is 7 to 8. If the interlayer insulating film is formed using an HSQ film with a relative dielectric constant of about 3, the parasitic capacitance at least doubles. Thus, the operation speed of the semiconductor device (more specifically, a logic system of a semiconductor device) is reduced. Alternatively, since a groove wiring cannot be formed using a low dielectric constant film as an interlayer insulating film, there is a limitation on a low dielectric constant of the interlayer insulating film.

SUMMARY OF THE INVENTION

It is an object of the present invention to provide a simple etching method in which a low dielectric constant film can be effectively used as an interlayer insulating film and to reduce parasitic capacitance between groove wirings, by easily performing dry etching of an SiC film.

It is another object of the present invention to shorten a manufacturing process and reduce a manufacturing cost of a semiconductor device.

To overcome the aforementioned related art problems and to achieve at least the aforementioned objects, a method of etching a silicon carbide film is provided, comprising forming a silicon carbide film on a semiconductor substrate, and etching said silicon carbide film with an etching gas that comprises a halogen compound and a nitrogen containing gas.

Additionally, a method of manufacturing a semiconductor device is provided, comprising (a) forming a wiring on a semiconductor substrate, (b) forming a silicon carbide film on said wiring, (c) forming an interlayer insulating film on said silicon carbide film, (d) etching said interlayer insulating film to form a via hole by a first etching gas, and (e) etching said silicon carbide film that is exposed in said via hole, by a second etching gas comprising a halogen compound and a nitrogen containing gas.

Further, a method of manufacturing a semiconductor device is provided, comprising (a) forming a wiring on a semiconductor substrate, (b) forming a first silicon carbide film on said wiring, (c) forming a first interlayer insulating film on said first silicon carbide film, (d) forming a second silicon carbide film on said first interlayer insulating film, (e) forming a second interlayer insulating film on said second silicon carbide film, (f) etching said second interlayer insulating film an d said second silicon carbide film, and then etching said first interlayer insulating film to form a via hole by a first etching gas, (g) etching said second interlayer insulating film to form a wiring groove by using said first silicon carbide and said second silicon carbide as an etching stopper, and (h) etching said first silicon carbide film exposed in said via hole by a second etching gas comprising a halogen compound and a nitrogen containing gas.

Therefore, according to one embodiment of the etching method of the present invention, in a dry etching of an SiC film used in manufacturing a semiconductor device, a gas containing nitrogen is added to an etching gas containing a halogen compound. Such a halogen compound is a fluorine compound. The fluorine compound is fluorocarbon, nitrogen trifluoride ($NF_3$), or sulfur hexafluoride ($SF_6$). The fluorocarbon is $CF_4$, $CHF_3$, $CH_2F_2$, $CH_3F$, or $C_4F_8$. Here, an oxygen gas may be mixed with the etching gas containing the fluoro-carbon.

Alternatively, according to the etching method of the present invention, in a dry etching of a lamination film of an SiC film and an interlayer insulating film which is made of, a silicon oxide film used for a semiconductor device, a silsesquioxane insulating film, or a silica film including at least one bonding of an Si—H bonding, an Si—$CH_3$ bonding and an Si—F bonding, a gas containing nitrogen is added to an etching gas containing a halogen compound, which is used in dry etching of the interlayer insulating film in the dry etching of the SiC film.

Then, the gas containing nitrogen is a nitrogen gas, an ammonia gas, or a nitrous oxide gas. An end point detection in the dry etching of the SiC film is performed by measuring an light emitting intensity in a wavelength of 387 nm from a reaction product CN.

According to the etching method of the SiC film of the present invention, the added nitrogen is plasma-excited and then chemically bonded to carbon (C) of the SiC film as a material to be etched, so that a reaction product CN with a high volatility is formed. Thus, the dry etching of the SiC film, which is difficult until now is very easy.

Alternatively, a method of manufacturing a semiconductor device, according to the represent invention is a method of manufacturing a multilayer wiring structure, including the steps of: forming an SiC film for covering on a lower layer wiring; forming an interlayer insulating film for covering the SiC film, and forming a via hole which reaches a surface of the SiC film and a wiring groove connecting with the via hole by dry-etching a predetermined region of the interlayer insulating film; removing the SiC film exposed in a region of the via hole by etching using the interlayer insulating film as an etching mask such that the via hole penetrates the SiC film to the surface of the lower layer wiring; and filling the penetrating via hole and the wiring groove with a conductive material to form a groove wiring connecting with the lower layer wiring, and removal of the SiC film by etching is performed by adding the gas containing nitrogen to the etching gas containing the halogen compound.

Alternatively, a method of manufacturing a semiconductor device, according to the present invention, is in manufacturing a layer wiring structure, a method of manufacturing a multilayer wiring structure, including the steps of: forming a first SiC film for covering on a lower layer wiring; forming a first interlayer insulating film, a second SiC film, and a second interlayer insulating film in this order on the first SiC film; dry etching the second interlayer insulating film, the second SiC film, and the first interlayer insulating film in succession to form a via hole which reaches a surface of the first SiC film; dry etching a predetermined region of the second interlayer insulating film using the second SiC film as an etching stopper layer to form a wiring groove connecting with the via hole; after the formation of the wiring groove, removing the first SiC film exposed in a region of the via hole using the second interlayer insulating film as an etching mask such that the via hole penetrates the first SiC film to the surface of the lower layer wiring; and filling the penetrating via hole and the wiring groove with a conductive material to form a groove wiring connecting with the lower layer wiring, and removal of the SiC film is performed by adding the gas containing nitrogen to the etching gas containing the halogen compound. Here, the second interlayer insulating film may be made from two layers to be laminated of different kinds of insulating films.

Then, the interlayer insulating film, the first interlayer insulating film, or the second interlayer insulating film is made of a silicon oxide film, a silsesquioxane insulating film, or a silica film including at least one bonding of an Si—H bonding, an Si—$CH_3$ bonding and an Si—F bonding. Also, the silsesquioxane insulating film is hydrogen silsesquioxane, methyl silsesquioxane, methylated hydrogen silsesquioxane, or fluorinated silsesquioxane. Further, the lower layer wiring or the groove wiring is made of copper (i.e., Cu).

As described above, according to the present invention, the dry etching of the SiC film is easily performed, and the SiC film can be easily applied as a stopper layer in manufacturing of a multiplier wiring structure such as a dual damascene structure. Thus, a parasitic capacitance between a lower layer wiring and an upper layer wiring in the multilayer wiring structure is reduced, and a parasitic capacitance between wiring layers of the same layer due to a fringe effect generated between wirings of the same layer is largely reduced. Further, a low dielectric constant film can be effectively used as an interlayer insulating film, and a parasitic capacitance between groove wirings can be reduced.

Also, a lamination film of the interlayer insulating film and the SiC film, constituting a semiconductor device, can be processed by etching using a simple method. In addition, a manufacturing process is shortened and a manufacturing cost of a semiconductor device is reduced.

BRIEF DESCRIPTION OF THE DRAWINGS

The above and other objects, advantages and features of the present invention will be more apparent from the following description taken in conjunction with the accompanying drawings, in which.

BRIEF DESCRIPTION OF THE INVENTION

When a related art groove wiring using copper as a conductive material is formed, since copper is easily oxidized, it is necessary to form an insulating film without oxygen as the above etching stopper layer. Also, to reduce parasitic capacitance between wirings, an insulating film with a low dielectric constant is desired. The present invention uses an effective etching gas in dry etching of a SiC film by an RIE, which is not known in the related art.

To overcome at least the aforementioned problems and disadvantages, a trial experiment was performed, considering that the interlayer insulating film and the SiC film can be etched using similar etching gases. Accordingly, the first and second preferred embodiments of the present invention were developed.

Figure 1A:
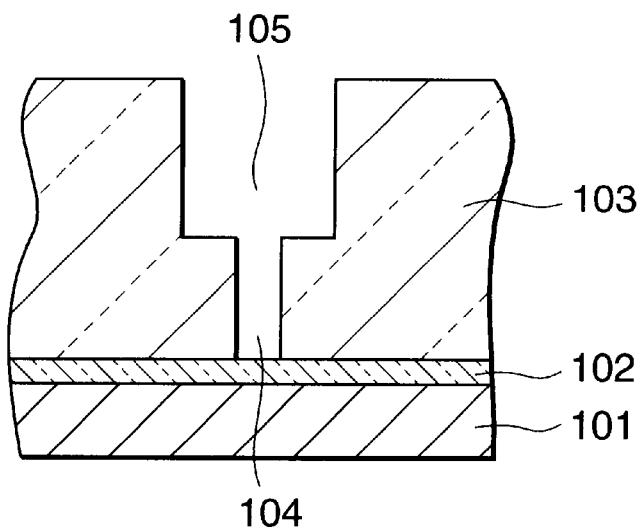
FIGS. 1A to 1C illustrate cross sectional views of a manufacturing process of a related art wiring structure.
Figure 1B:
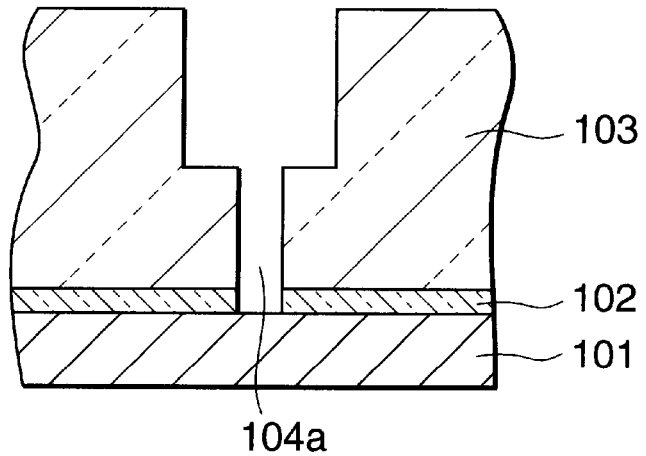
Figure 1C:
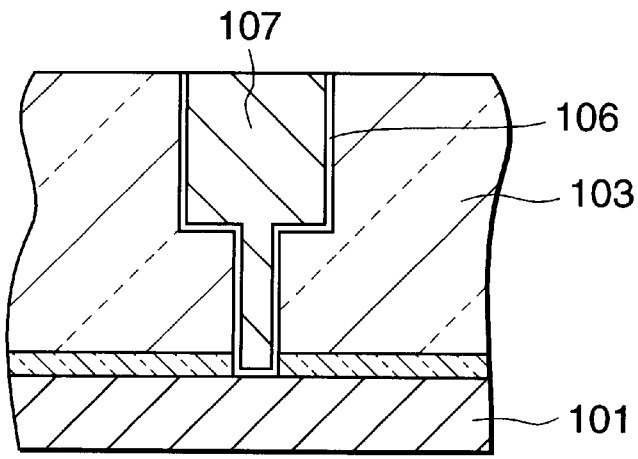
Figure 2A:
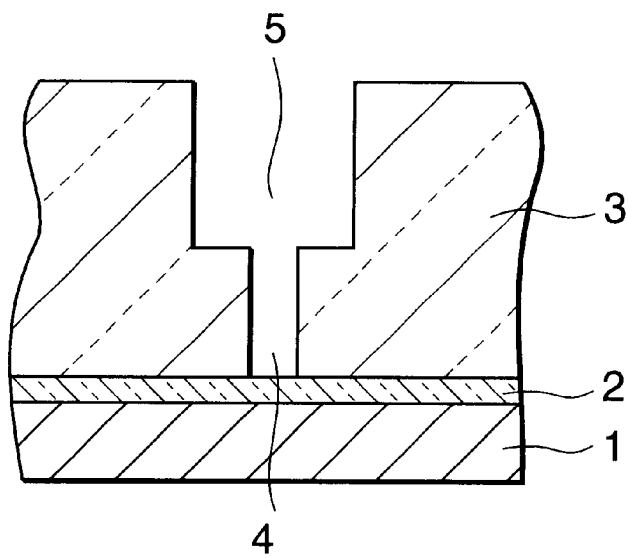
FIGS. 2A to 2C illustrate cross sectional views of a manufacturing process of a wiring structure according to a first preferred embodiment of the present invention.
Figure 2B:
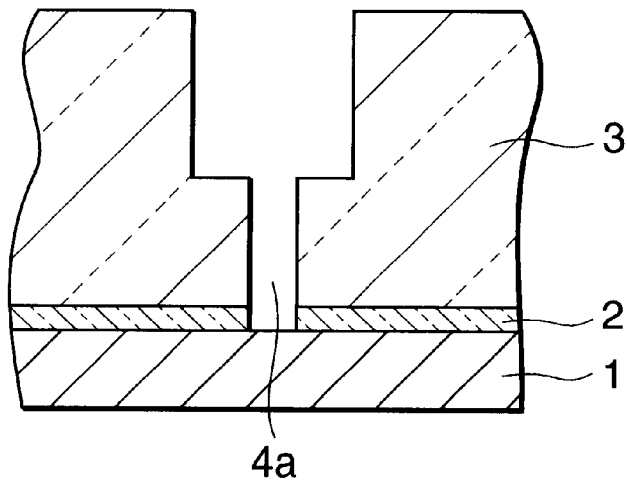
Figure 2C:
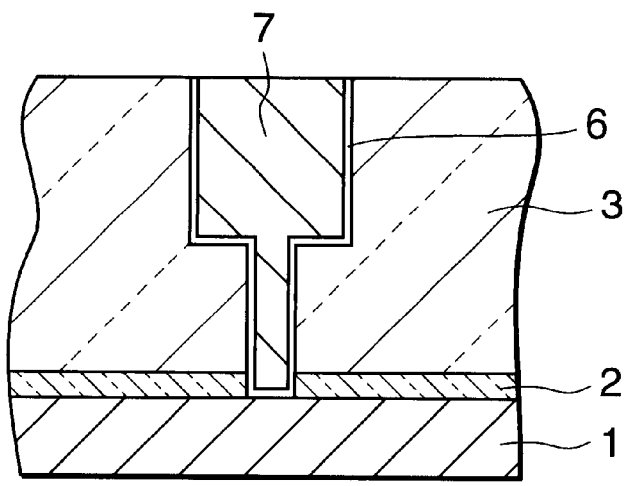

FIGS. 2A to 2C illustrate cross sectional views of manufacturing process orders of a dual damascene wiring structure according to the first preferred embodiment of the present invention. As shown in FIG. 2A, a lower layer wiring 1 is formed using copper (i.e., Cu) over a semiconductor substrate through an insulating film. Then, an SiC layer 2 having a film thickness of about 50 nm is formed to cover the lower layer wiring 1. The SiC layer 2 is formed by a plasma CVD method using trimethylsilane ($SiH(CH_3)_3$) as a reaction gas. The SiC layer 2 has an insulation characteristic, and its relative dielectric constant is approximately 4.6.

Next, an interlayer insulating film 3 is formed using a silicon oxide film on the SiC layer 2. Then, using a well-known photolithography and dry etching techniques, a via hole 4 that reaches an upper surface of the SiC layer 2 is formed in the interlayer insulating film 3, and further, a wiring groove 5 is formed in the interlayer insulating film 3. Thereafter, a resist mask that is used as an etching mask is removed by an ashing method, as described above in the related art. In the ashing process of this resist mask, as shown in FIG. 2A, the lower layer copper (i.e., Cu) wiring 1 is protected by the SiC layer 2 against oxidation.

Next, as shown in FIG. 2B, the SiC layer 2 is dry-etched using the interlayer insulating film 3 as an etching mask, to form a via hole 4a that reaches the surface of the lower layer wiring 1. Here, dry etching of the SiC layer 2 is performed as follows. A mixture gas of, for example, but not by way of limitation, $CH_2F_2$, $O_2$, and Ar, to which a nitrogen gas ($N_2$) is introduced into a space between parallel plate electrodes. The nitrogen mixed gas is then plasma-excited with a high frequency energy of about 13.56 MHz, which is applied between the electrodes. In the above dry etching process, a ratio of an etching rate of the SiC layer 2 to that of the interlayer insulating film 3 (i.e., a selection ratio) is about 5 or larger. Etching of the SiC layer 2 is described in greater detail below based on FIG. 3.

In the etching process of the first preferred embodiment of the present invention, the related art problems of the etching step are overcome because an etching amount in the surface portion of the interlayer insulating film 3 is small. In addition, even if the SiC layer 2 is etched to expose the surface of the lower layer wiring 1, the surface of the lower layer wiring 1 is not oxidized.

In the above described dry etching of the SiC layer 2, an end point detection of etching may be performed by measuring a change in a light emitting intensity with a wavelength of 387 nm from CN as a reaction product in plasma. Here, the reaction product CN is a compound of SiC as an object to be etched, and the added nitrogen. Alternatively, in the case of the above described etching gas, the end point detection of etching may be performed by measuring a change in an light emitting intensity with a wavelength of 451 nm or 483 nm from CO as a reaction product.

Next, as illustrated in FIG. 2C, the related art process art is performed, so that after a thin tantalum nitride film and a copper (i.e., Cu) film are laminated, the lamination film is processed by CMP to form a barrier layer 6 and a groove wiring 7 in a predetermined region of the interlayer insulating film 3. By the above-described processes, a dual damascene wiring structure is formed.

Figure 3:
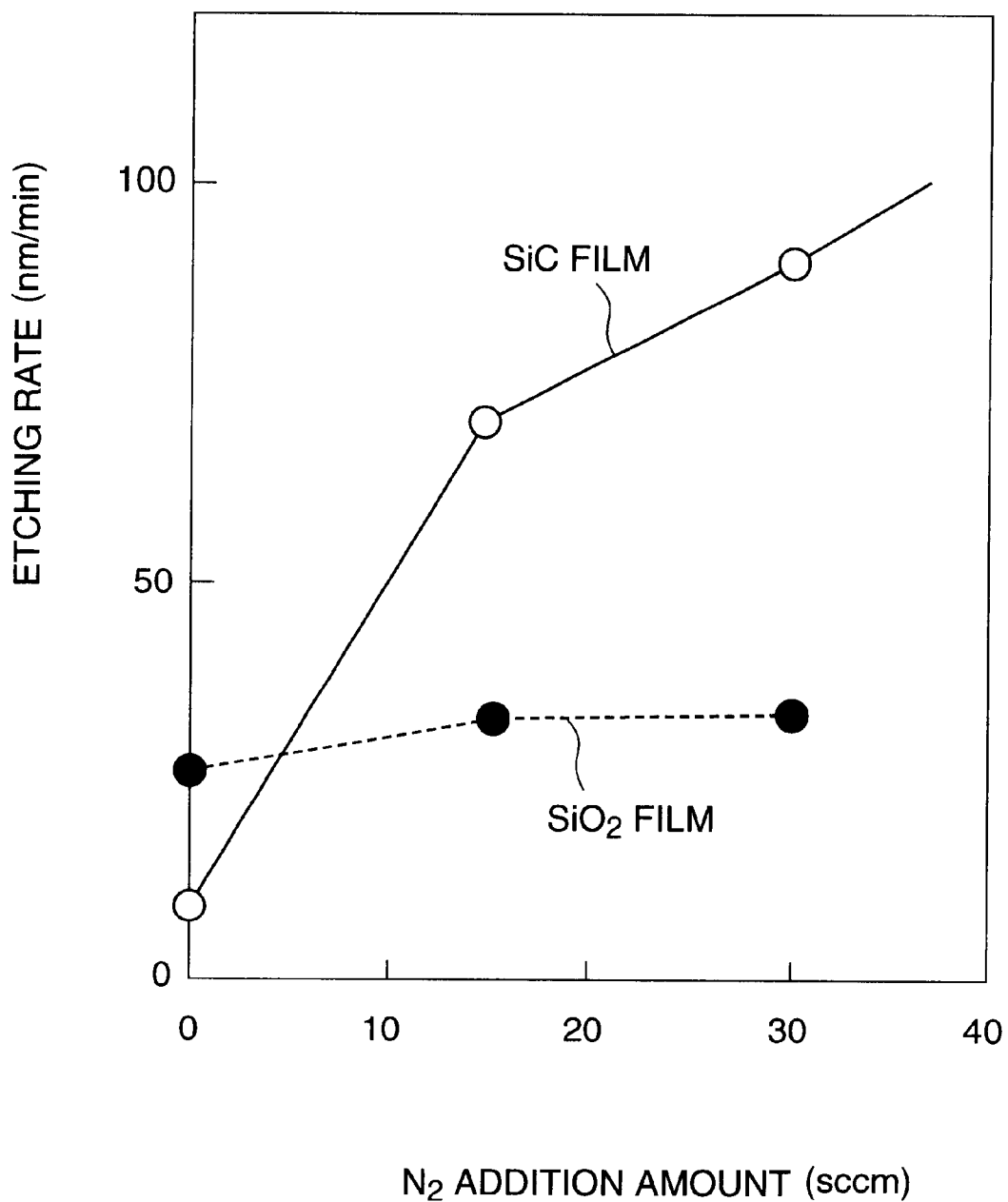
FIG. 3 is a graph representing a nitrogen addition effect in etching of an SiC film according to the first preferred embodiment of the present invention.

Next, dry etching of the above SiC layer by RIE is described. FIG. 3 is a graph representing changes in etching rates with respect to a silicon oxide ($SiO_2$) film and an SiC film where nitrogen gas is added to the above mixture gas of $CH_2F_2$, $O_2$, and Ar. In FIG. 3, a $CH_2F_2$ gas flow rate is about 20 sccm, an $O_2$ gas flow rate is about 5 sccm, and an Ar gas flow rate is about 200 sccm. The x-axis of FIG. 3 represents an $N_2$ gas flow rate, and the y-axis of FIG. 3 represents an etching rate with respect to the SiC film and the $SiO_2$ film.

As shown in FIG. 3, when the nitrogen gas is not added to the mixture gas of $CH_2F_2$, $O_2$, and Ar, etching of the SiC film does not progress substantially, and the etching rate of the $SiO_2$ film is greater than the etching rate of the SiC film.

As nitrogen gas is added, the etching rate of the SiC film increases substantially, while the etching rate of the $SiO_2$ film remains substantially unchanged. Thus, a ratio of the etching rate of the SiC film to the etching ratio of the $SiO_2$ film (i.e., the selection ratio) increases. A similar effect occurs when, instead of the $SiO_2$ film an Si—O based insulating film with a low relative dielectric constant (e.g., the silsesquioxane insulating film), or the silica film including at least one bonding of, an Si—H bonding, an Si—$CH_3$ bonding and an Si—F bonding, is used.

In an RIE for the SiC film, if a fluorocarbon gas such as $CF_4$, $CHF_3$, $C_4F_8$, or $CH_3F$ is used instead of the $CH_2F_2$ gas, the substantially same effect as the addition of nitrogen gas occurs.

In addition, even if nitrogen gas is added to a gas of a fluorine compound such as $NF_3$ or $SF_6$, the above described etching rate effect occurs. In the case of a fluorine compound gas, a mixture of an $O_2$ gas is not required because a gas mixture of this oxygen gas increases the amount of fluorine radical in the above plasma excitation, and a substantial amount of the fluorine radical can be formed by using the gas of the fluorine compound, such as $NF_3$ or $SF_6$. Also, in the case of the fluorine compound gas, since an excess amount of organic polymer is not generated in etching, the mixture of the $O_2$ gas is not required.

If a nitrous oxide ($N_2O$) gas or an ammonia ($NH_3$) gas is added instead of nitrogen gas, the above-described effect occurs, as the dry etching of the SiC film is performed very easily by adding the nitrogen contained gas.

In a dry etching process using ICP (inductive coupled plasma), a plasma excitation method is performed with a microwave, and a plasma excitation method with two frequencies, which are well known, except for the above plasma excitation method with a high frequency, is used. As a result, the effect by the above addition of the nitrogen contained gas occurs even in those cases.

In the present invention, the etching gas for the interlayer insulating film is almost identical to the etching gas for the SiC film. Therefore, it is an advantage of the present invention that a multilayer wiring structure such as a groove wiring can be simply manufactured, so that a manufacturing process of a semiconductor device is shortened and its manufacturing cost is reduced.

FIGS. 4A to 4G illustrate cross sectional views of a manufacturing process of a dual damascene wiring structure according to the second preferred embodiment of the present invention. Silsesquioxane with a low relative dielectric constant (e.g., an HSQ film) is used as an interlayer insulating film.

Figure 4A:
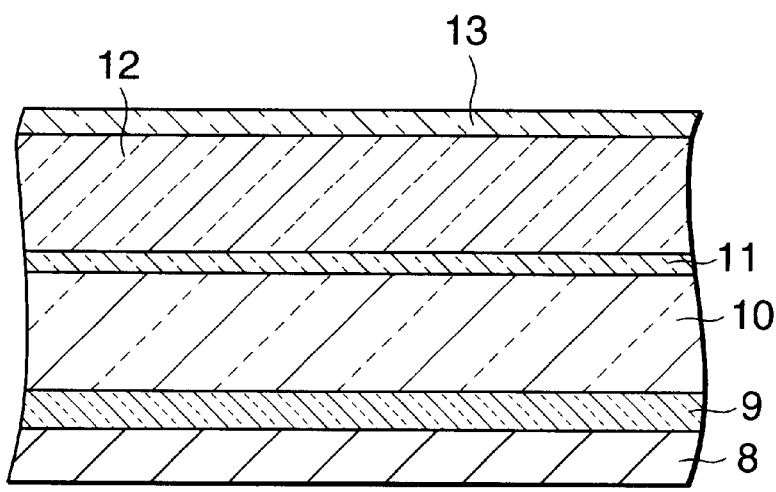
FIGS. 4A to 4G illustrate cross sectional views of a manufacturing process of a wiring structure according to a second preferred embodiment of the present invention.

As shown in FIG. 4A, a lower layer wiring 8 is formed using a copper (i.e., Cu) film. Subsequently, a first SiC layer 9 having a film thickness of about 50 nm, a first HSQ film 10 having a film thickness of about 500 nm, a second SiC layer 11 having a film thickness of about 50 nm, and a second HSQ film 12 having a film thickness of about 500 nm, are sequentially laminated on the lower layer wiring 8. A coating solution as the HSQ film is applied onto the entire surface, baked at a temperature of about 150° C., and further subjected to a thermal treatment with a temperature of about 400° C., in a diffusion furnace, to form the HSQ films 10, 12. Then, a CMP stopper layer 13 is formed using a silicon oxide film having a film thickness of about 15 nm on the second HSQ film 12.

Figure 4B:
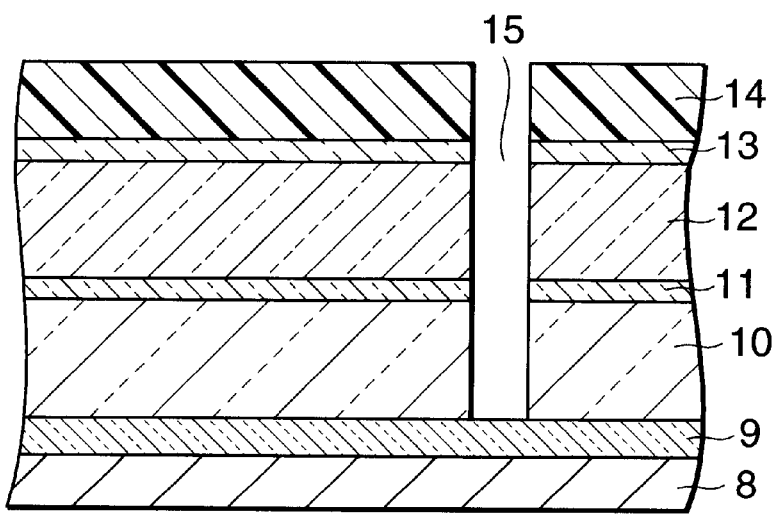

Next, as shown in FIG. 4B, a first resist mask 14 is formed by a well known photolithography technique. Using the first resist mask 14 as an etching mask, the CMP stopper layer 13, the second HSQ film 12, the second SiC layer 11, and the first HSQ film 10 are dry-etched in succession to form a via hole 15 that reaches an upper surface of the first SiC layer 9. In the dry etching with respect to the CMP stopper layer 13, the first and second HSQ films 10, 12, a mixture gas of $CH_2F_2$, $O_2$ and Ar is used as an etching gas. Then, in the dry etching of the second SiC layer 11, as described in the first embodiment, a predetermined amount of nitrogen gas is added to the above mixture gas.

Figure 4C:
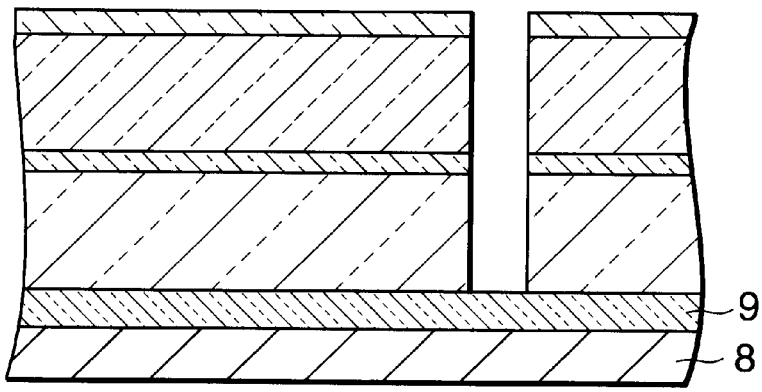

Then as shown in FIG. 4C, the first resist etching mask 14 is removed by the above-described ashing method. In the ashing process, the SiC layer 9 protects the lower layer wiring 8 made of copper (i.e., Cu).

Figure 4D:
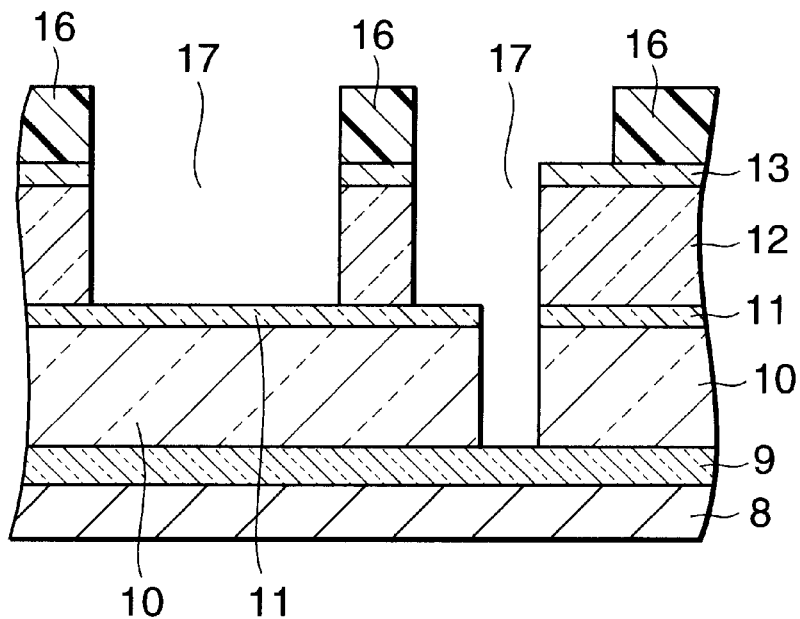

Next, as shown in FIG. 4D, using a second resist mask 16 having a wiring groove pattern as an etching mask, the CMP stopper layer 13 and the second HSQ film 12 are dry-etched to form a wiring groove 17. Here, the dry etching with respect to the CMP stopper layer 13 and the second HSQ film 5 is performed by plasma-exciting a mixture gas of $C_4F_8$, $O_2$, and Ar. When such an etching gas is used, since an etching rate of the second SiC layer 11 is reduced, the second SiC layer 11 functions as an etching stopper layer. Thus, the first HSQ film 10 is protected by the second SiC layer 11 against the dry etching.

Next, the second resist mask 16 used as the etching mask is removed by ashing method, such that the lower layer copper wiring 8 is protected by the SiC layer 9 against oxidation.

Figure 4E:
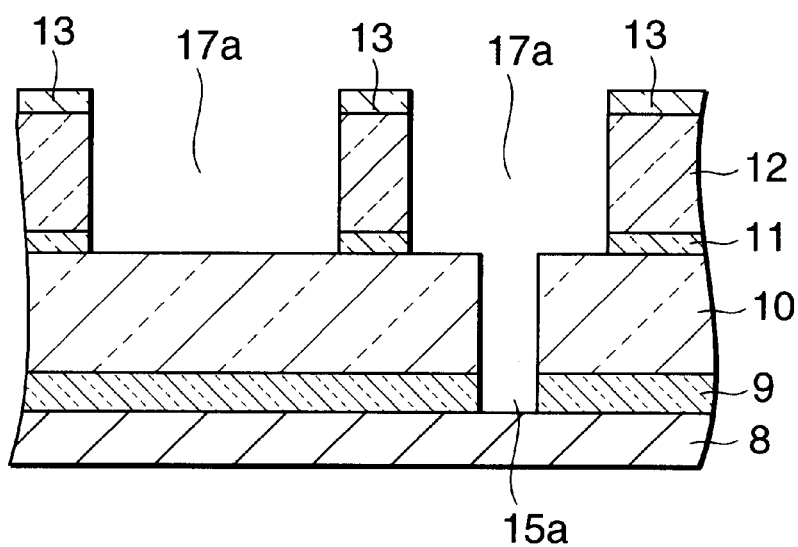

Next, as shown in FIG. 4E, using the CMP stopper layer 13 as an etching mask, the second SiC layer 11 and the first SiC layer 9 in the wiring groove 17 are dry-etched to form a via hole 15a which reaches the surface of the lower layer wiring 8. In this process, the wiring groove 17 is changed into a wiring groove 17a.

In the dry etching at the second SiC layer 11 and the first SiC layer 9, a nitrogen gas or a nitrous oxide gas is added to a mixture gas of $NF_3$ and Ar as a reaction gas, to perform a plasma excitation. In the above dry etching, a ratio of an etching rate of the SiC layer to that of the CMP stopper layer (i.e., a selection ratio) is about 10. Thus, after the above etching, the CMP stopper layer 13 has a sufficient film thickness of about 10 nm.

In the above dry etching of the SiC layer, an end point detection of etching is performed by measuring a change in an light emitting intensity with a wavelength of 387 nm from a CN as a reaction product in plasma. Here, the reaction product CN is a compound of the SiC layer as an object to be etched, and the added nitrogen.

Figure 4F:
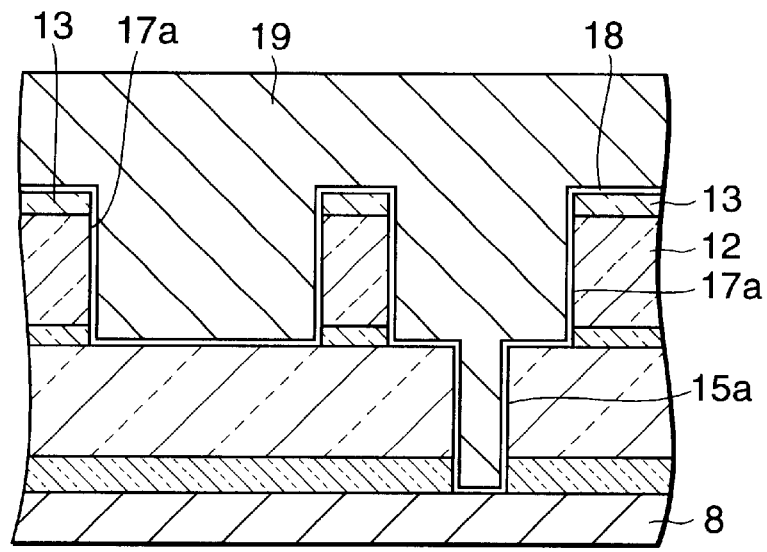

Subsequently, as shown in FIG. 4F, a barrier layer 18 is formed to electrically connect with the lower layer wiring 8 in inner walls of the via hole 15a, the wiring groove 17a and the surface of the CMP stopper layer 13. Then, a copper film 19 having a film thickness of about 1000 nm is formed by a plating method or the like.

The copper film 19 and the barrier layer 18 are then processed by CMP, where the CMP stopper layer 13 is a CMP stopper film that protects the second HSQ film 12 against the effects of the CMP process.

Figure 4G:
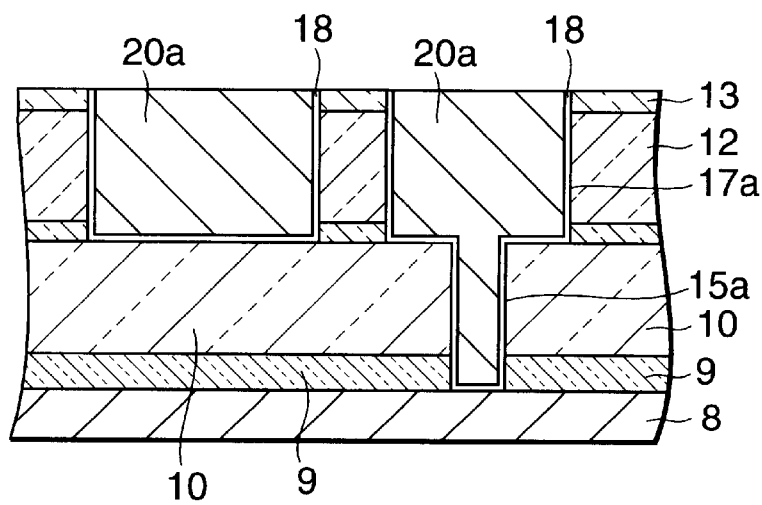

By the above processes, as shown in FIG. 4G, groove wirings 20, 20a are formed over the lower layer wiring 8 through the first SiC layer 9 and the first HSQ film 10, which are an interlayer insulating film. Here, the groove wirings 20, 20a sandwich the barrier layer 18 in the wiring groove 17a next to the second HSQ film 12. Then, the groove wiring 20 is connected with the lower layer wiring 8 through the via hole 15a in the first SiC layer 9 and the first HSQ film 10. Thus, a dual damascene wiring structure is obtained.

In this second embodiment, a Si—O based low dielectric constant film such as methyl silsesquioxane (called MSQ film) is used as silsesquioxane, except for an HSQ film, can be effectively used as an interlayer insulating film in a multilayer wiring structure. In addition, a parasitic capacitance between wirings in a damascene wiring structure is easily reduced. In particular, a parasitic capacitance between the lower layer wiring 8 and the groove wiring 20a, and a parasitic capacitance generated due to a fringe effect between the groove wirings 20 and 20a is largely reduced.

Even if the above silsesquioxane is methylated hydrogen silsesquioxane, or fluorinated silsesquioxane, except for an HSQ film and an MSQ film, the present invention can be applied as the above. Further, even if where, except for silsesquioxane, a silica film including at least one bonding of an Si—H bonding, an Si—$CH_3$ bonding and an Si—F bonding, is used as an interlayer insulating film, the present invention can be applied as the above. Alternatively, if an organic insulating film is used as an interlayer insulating film, the present invention can be applied as the above.

If an SiC film is dry-etched using a compound containing fluorine as an etching gas, the SiC film is effectively etched by an addition of a gas containing nitrogen. The present invention is not limited to the case of a compound gas containing fluorine. Even if a compound of halogen such as chlorine is used as an etching gas, the SiC film can be effectively etched by an addition of the gas containing nitrogen.

In the preferred embodiments of the present invention, a dual damascene wiring structure is used. However, the present invention is not limited thereto, and can be applied to the case where a commonly used wiring structure or a damascene wiring structure is formed, as the above. Further, the present invention is not limited to the case where a wiring structure is formed, and can be applied to the case where an SiC film used for manufacturing a semiconductor device is processed, as described above.

The present invention is not limited to the above embodiment, but various improvements and modifications may be naturally made in the scope not departing from the gist of the present invention.

As described above, according to the present invention, in the dry etching of the SiC film used for manufacturing a semiconductor device, a gas containing nitrogen is added to an etching gas containing a halogen compound. Then, the dry etching method of the SiC film is applied to the case where a multilayer wiring structure such as groove wirings is manufactured.

According to the present invention, the above dry etching of the SiC film is performed very easily, and the SiC film is effectively applied as a stopper layer to the case where a multilayer wiring structure such as a dual damascene structure is manufactured.

Therefore, it is an advantage of the present invention that a parasitic capacitance between a lower layer wiring and an upper layer wiring in the multilayer wiring structure is reduced, and a parasitic capacitance between wiring layers of the same layer due to a fringe effect generated between wirings of the same layer is reduced. In addition, a low dielectric constant film can be effectively used as an interlayer insulating film, and a parasitic capacitance between groove wirings can be reduced by using a simple method. Further, a manufacturing process may be shortened and a manufacturing cost of a semiconductor device may be reduced.

As additional advantages according to the present invention, a high integration, a high speed operation, and a multi-function in a semiconductor device are further improved as a semiconductor element becomes smaller.

The present invention is not limited to the above embodiments, and it is contemplated that numerous modifications may be made without departing from the spirit and scope of the invention. The etching method, as described above with reference to the figures, is a merely an exemplary embodiment of the invention, and the scope of the invention is not limited to these particular embodiments. Accordingly, other structural configurations may be used, without departing from the spirit and scope of the invention as defined in the following claims.

What is claimed is:

1. The method of etching a silicon carbide film, comprising:
   forming a silicon carbide film on a semiconductor substrate; and
   etching said silicon carbide urn with an etching gas that comprises a fluoro-carbon compound and a nitrogen containing gas.

2. The method as claimed in claim 1, wherein said fluoro-carbon compound comprises at least one fluorocarbon compound selected from a group consisting of $CF_4$, $CHF_3$, $CH_2F_2$, $CH_3F$, and $C_4F_8$.

3. The method as claimed in claim 2, wherein said etching gas further comprises an oxygen gas.

4. The method as claimed in claim 3, wherein said nitrogen containing gas comprises at least one nitrogen containing gas selected from a group consisting of a nitrogen gas, an ammonia gas, and a nitrous oxide gas.

5. The method as claimed in claim 4, further comprising:
   detecting an end point of etching said silicon carbide film by measuring a light emitting intensity in a wavelength of 387 nm.

6. The method as claimed in claim 1, wherein said nitrogen containing gas comprises at least one nitrogen containing gas selected from a group consisting of a nitrogen gas, an ammonia gas, and a nitrous oxide gas.

7. A method of manufacturing a semiconductor device, comprising:
   forming a wiring on a semiconductor substrate;
   forming a silicon carbide film on said wiring;
   forming an interlayer insulating film on said silicon carbide film;
   etching said interlayer insulating film to form a via hole by a first etching gas;
   etching said silicon carbide film that is exposed in said via hole, by a second etching gas comprising a fluoro-carbon compound and a nitrogen containing gas by using said interlayer insulating film as a mask.

8. The method as claimed in claim 7, wherein said first etching gas comprises said fluoro-carbon compound.

9. The method as claimed in claim 8, further comprising:
   forming a wiring groove connecting to said via hole; and
   filling said via hole and said wiring groove with a conductive material.

10. The method as claimed in claim 9, wherein said conductive material comprises a barrier layer and a wiring material.

11. The method as claimed in claim 8, wherein said interlayer insulating film comprises a silicon oxide film.

12. The method as claimed in claim 8, wherein said interlayer insulating film comprises a silsesquioxane insulating film.

13. The method as claimed in claim 8, wherein said interlayer insulating film comprises a silica film including at least one bonding of a Si—H bonding, a Si—CH$_3$ bonding or a Si—F bonding.

14. The method as claimed in claim 10, wherein said wiring material comprises a copper.

15. The method as claimed in claim 11, wherein said fluoro-carbon compound comprises at least one fluoro-carbon compound selected from a group consisting of $CF_4$, $CHF_3$, $CH_2F_2$, and $C_4F_8$.

16. The method as claimed in claim 7, wherein said second etching gas comprises an oxygen gas.

17. The method as claimed in claim 16, wherein said nitrogen containing gas comprises at least one nitrogen containing gas selected from a group consisting of a nitrogen gas, an ammonia gas, and a nitrous oxide gas.

18. A method of manufacturing a semiconductor device, comprising:
   forming a wiring on a semiconductor substrate;
   forming a first silicon carbide film on said wiring;
   forming a first interlayer insulating film on said first silicon carbide film;
   forming a second silicon carbide film on said first interlayer insulating film;
   forming a second interlayer insulating film on said second silicon carbide film;
   etching said second interlayer insulating film and said second silicon carbide film, and then etching said first interlayer insulating film to form a via hole by a first etching gas;

etching said second interlayer insulating film to form a wiring groove by using said first silicon carbide and said second silicon carbide as an etching stopper;

etching said first silicon carbide film exposed in said via hole by a second etching gas comprising a fluoro-carbon compound and a nitrogen containing gas by using said second interlayer insulating film as a mask.

19. The method as claimed in claim 18, wherein said first etching gas comprises said fluoro-carbon compound.

20. The method as claimed in claim 18, wherein said fluoro-carbon compound comprises at least one fluoro-carbon compound selected from a group consisting of $CF_4$, $CHF_3$, $CH_2F_2$, $CH_3F$, and $C_4F_8$.

21. The etching method as claimed in claim 18, wherein said second etching gas comprises an oxygen gas.

22. The method as claimed in claim 21, wherein said nitrogen containing gas comprises at least one nitrogen containing gas selected from a group consisting of a nitrogen gas, an ammonia gas, and a nitrous oxide gas.

23. A method of etching a silicon carbide film, comprising:

forming a silicon carbide film on a semiconductor substrate; and etching said silicon carbide film with an etching gas that comprises a sulfur hexafluoride and a nitrogen containing gas.

* * * * *